US009853627B2

(12) United States Patent
Kubota et al.

(10) Patent No.: US 9,853,627 B2
(45) Date of Patent: Dec. 26, 2017

(54) CRYSTAL RESONATOR, AND PRODUCTION METHOD THEREFOR

(71) Applicant: FUJITSU LIMITED, Kawasaki-shi, Kanagawa (JP)

(72) Inventors: Hajime Kubota, Kawasaki (JP); Masayuki Itoh, Kawasaki (JP); Masakazu Kishi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 798 days.

(21) Appl. No.: 14/465,221

(22) Filed: Aug. 21, 2014

(65) Prior Publication Data

US 2014/0361666 A1    Dec. 11, 2014

Related U.S. Application Data

(63) Continuation of application No. PCT/JP2012/001467, filed on Mar. 2, 2012.

(51) Int. Cl.
*H01L 41/053* (2006.01)
*H01L 41/22* (2013.01)
(Continued)

(52) U.S. Cl.
CPC ............ *H03H 9/17* (2013.01); *H01L 41/0475* (2013.01); *H01L 41/29* (2013.01); *H03H 3/02* (2013.01);
(Continued)

(58) Field of Classification Search
CPC .......... H03H 9/17; H03H 3/02; H03H 9/1035; H01L 41/0475; H01L 41/29; H01L 41/22
(Continued)

(56) References Cited

U.S. PATENT DOCUMENTS 3,773,684 A * 11/1973 Marks .................... G02F 1/172
                                                          252/583
5,243,861 A *  9/1993 Kloeck .................. B81B 7/007
                                                          257/415
(Continued)

FOREIGN PATENT DOCUMENTS

JP        51-103358 U      8/1976
JP       2000-286671 A    10/2000
(Continued)

OTHER PUBLICATIONS

International Search Report dated Apr. 24, 2012 corresponding to International Patent Application No. PCT/JP2012/001467 and English translation thereof.
(Continued)

*Primary Examiner* — Thomas Dougherty
(74) *Attorney, Agent, or Firm* — Squire Patton Boggs (US) LLP

(57) ABSTRACT

A crystal resonator includes: lower glass plates on which first electrodes are formed so as to extend from side surfaces to a bottom surface of the lower glass plates; a crystal plate which is provided over the lower glass plates and on which second electrodes to be coupled to the first electrodes are formed on a surface in contact with the lower glass plates; and an upper glass plate which is provided over the crystal plate; wherein the side surfaces of the lower glass plates on which the first electrodes are formed are provided with a protrusion that extends in parallel with a top surface and the bottom surface of the lower glass plates and that extends from one end to the other end of each of the side surfaces, and wherein the first electrodes are formed on the side surfaces that include surfaces of the protrusion.

10 Claims, 8 Drawing Sheets

(51) Int. Cl.
*H03H 9/17* (2006.01)
*H01L 41/047* (2006.01)
*H01L 41/29* (2013.01)
*H03H 3/02* (2006.01)
*H03H 9/10* (2006.01)
*H03H 9/21* (2006.01)

(52) U.S. Cl.
CPC ......... *H03H 9/1035* (2013.01); *H03H 9/1021* (2013.01); *H03H 9/21* (2013.01); *Y10T 29/42* (2015.01)

(58) Field of Classification Search
USPC .................. 310/340, 344, 348, 365; 29/25.35
See application file for complete search history.

(56) References Cited

U.S. PATENT DOCUMENTS

| | | | | |
|---|---|---|---|---|
| 5,259,737 | A | * | 11/1993 | Kamisuki ............. B81B 3/0005 257/E21.233 |
| 5,567,880 | A | * | 10/1996 | Yokota .................. G01P 15/123 257/E27.006 |
| 5,647,932 | A | * | 7/1997 | Taguchi ................... H03H 3/02 148/DIG. 12 |
| 2003/0197569 | A1 | | 10/2003 | Mizusawa |
| 2003/0228452 | A1 | * | 12/2003 | Yu ....................... H01L 23/3738 428/209 |
| 2005/0212111 | A1 | * | 9/2005 | Terazaki ............. B81C 1/00119 257/686 |
| 2011/0187235 | A1 | | 8/2011 | Yoshimatsu |
| 2011/0309720 | A1 | | 12/2011 | Kawahara |
| 2012/0012356 | A1 | | 1/2012 | Satoh et al. |

FOREIGN PATENT DOCUMENTS

| | | |
|---|---|---|
| JP | 2002-121037 A | 4/2002 |
| JP | 2003-110397 A | 4/2003 |
| JP | 2003-318690 A | 11/2003 |
| JP | 2006-033265 A | 2/2006 |
| JP | 2009-135574 A | 6/2009 |
| JP | 2010-004455 A | 1/2010 |
| JP | 2010-087573 A | 4/2010 |
| JP | 2010-093675 A | 4/2010 |
| JP | 2011-155338 A | 8/2011 |
| JP | 2011-176787 A | 9/2011 |
| WO | WO 2010/114115 A1 | 10/2010 |

OTHER PUBLICATIONS

Japanese Office Action application No. 2014-501828 dated Jun. 23, 2015.

* cited by examiner

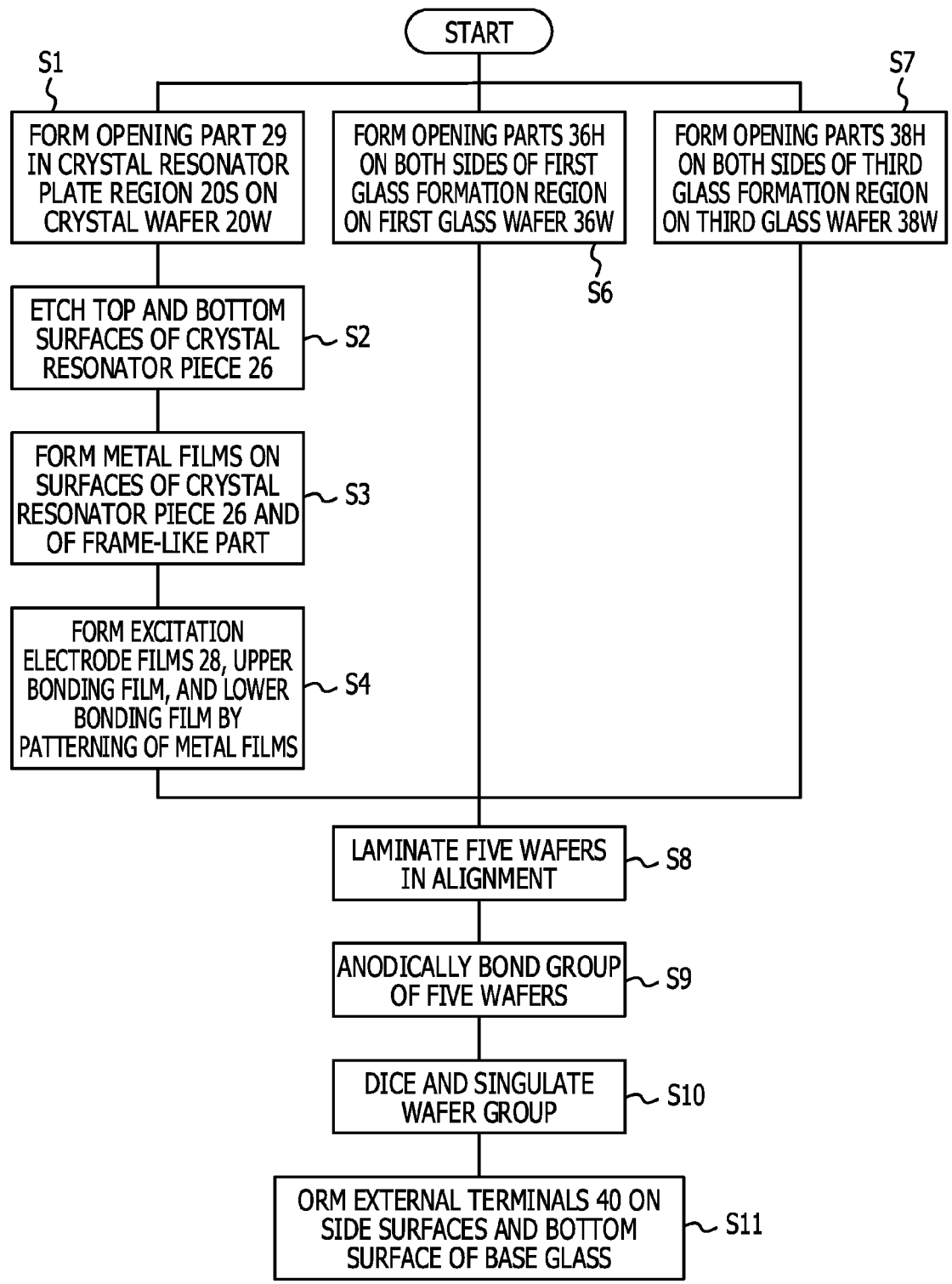

CRYSTAL RESONATOR, AND PRODUCTION METHOD THEREFOR

CROSS-REFERENCE TO RELATED APPLICATION

This application is a continuation application of International Application PCT/JP2012/001467 filed on Mar. 2, 2012 and designated the U.S., the entire contents of which are incorporated herein by reference.

FIELD

The embodiments discussed herein are related to crystal resonators for use in electronic equipment and the like and production methods therefor.

BACKGROUND

As a structure of a conventional crystal resonator, a crystal resonator 100 has been known in which a pair of lid bodies 92, 93 are bonded through bonding films 94, 95, 96 made of metal material, for instance, onto top and bottom surfaces of a crystal resonator plate 91 having a crystal resonator piece and a frame integrally formed therein as illustrated in FIG. 1A, for instance. External terminals 98 are formed on corner parts of the lower lid body 93 under the crystal resonator plate 91 so as to extend from side surfaces to a bottom surface of the lower lid body 93. The external terminals 98 provide electrical connection between electrode pads on a circuit board on which the crystal resonator 100 is mounted and the bonding films 95, 96 on the bottom surface of the crystal resonator plate 91. The bonding film 96 on the bottom surface of the crystal resonator plate 91 and the bonding film 94 on the top surface of the crystal resonator plate 91 are connected by through vias not illustrated. When a voltage is applied to the electrode pads on the circuit board, occurrence of a voltage difference between the bonding film 94 and the bonding film 95 causes resonance of the crystal resonator piece formed in the crystal resonator plate 91, so that a predetermined frequency is generated.

For mounting of electronic components on a circuit board, commonly, solder paste is applied onto a plurality of electrode pads on the circuit board, the plurality of electronic components are placed on the solder paste so that electrodes of the electronic components come into contact with the solder paste, the solder paste is simultaneously melted by reflow of the entire circuit board, and the plurality of electronic components are collectively fixed to the circuit board.

On condition that the electronic components are mounted on only one surface of the circuit board, problems hardly occur because the electronic components are collectively mounted by the reflow at one time. On condition that the electronic components are mounted on both surfaces of the circuit board, however, problems may occur because the reflow is performed twice due to demands on production.

FIG. 1B illustrates a problem that may occur when the crystal resonator 100 is mounted on a circuit board 80.

For mounting of the crystal resonator 100 on the circuit board 80, commonly, thin solder 82 is applied onto electrode pads 81 on the circuit board 80, the crystal resonator 100 is placed so that the external terminals 98 of the crystal resonator 100 come into contact with the solder 82, and the entire circuit board 80 is subjected to reflowing. Then the solder 82 is melted and soaks onto entire surfaces of the external terminals 98 of the crystal resonator 100. Then an Au constituent of the external terminals 98 is diffused into the solder 82 and an Au alloy is thereby formed. A melting point on the order of 200° C. of the Au alloy is lower than a melting point of 240° C. of lead-free solder and thus so-called solder erosion may occur in which the Au alloy is absorbed into the solder 82. When parts of the external terminals 98 undergo the solder erosion, the bonding films 95, 96 may be exposed on contact surfaces between the bonding films 95, 96 in the lower part of the crystal resonator 100 and the external terminals 98.

Upon performance of the second reflow in this state, the melted solder 82 may come into contact with the bonding films 95, 96 in the lower part. On this occasion, an Al constituent of the bonding films 95, 96 in the lower part may be diffused into the solder 82 and an Al alloy is thereby formed. A melting point on the order of 200° C. of the Al alloy is also lower than the melting point of 240° C. of lead-free solder and thus solder erosion may occur in which the Al alloy is absorbed into the solder 82.

FIG. 1B illustrates a state in which the bonding film 95 on the bottom surface of the crystal resonator piece 91 is made to recede by the solder erosion at a site designated by "X" in FIG. 1B. In such a state, the crystal resonator piece of the crystal resonator plate 91 fails to vibrate because the electrical connection between the bonding film 95 and the electrode pads 81 is lost. Then overall circuit malfunctions because the crystal resonator 100 generates a reference clock for operation of the circuit.

The following are reference documents:
[Document 1] Japanese Laid-open Patent Publication No. 2011-176787 and
[Document 2] Japanese Laid-open Patent Publication No. 2000-286671.

SUMMARY

According to an aspect of the invention, a crystal resonator includes: lower glass plates on which first electrodes are formed so as to extend from side surfaces to a bottom surface of the lower glass plates; a crystal plate which is provided over the lower glass plates and on which second electrodes to be coupled to the first electrodes are formed on a surface in contact with the lower glass plates; and an upper glass plate which is provided over the crystal plate; wherein the side surfaces of the lower glass plates on which the first electrodes are formed are provided with a protrusion that extends in parallel with a top surface and the bottom surface of the lower glass plates and that extends from one end to the other end of each of the side surfaces, and wherein the first electrodes are formed on the side surfaces that include surfaces of the protrusion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates the production method for the crystal resonator according to the first embodiment.

DESCRIPTION OF EMBODIMENTS

Herein below, preferred embodiments of techniques disclosed herein will be described in detail with reference to the accompanying drawings.

Figure 1A:
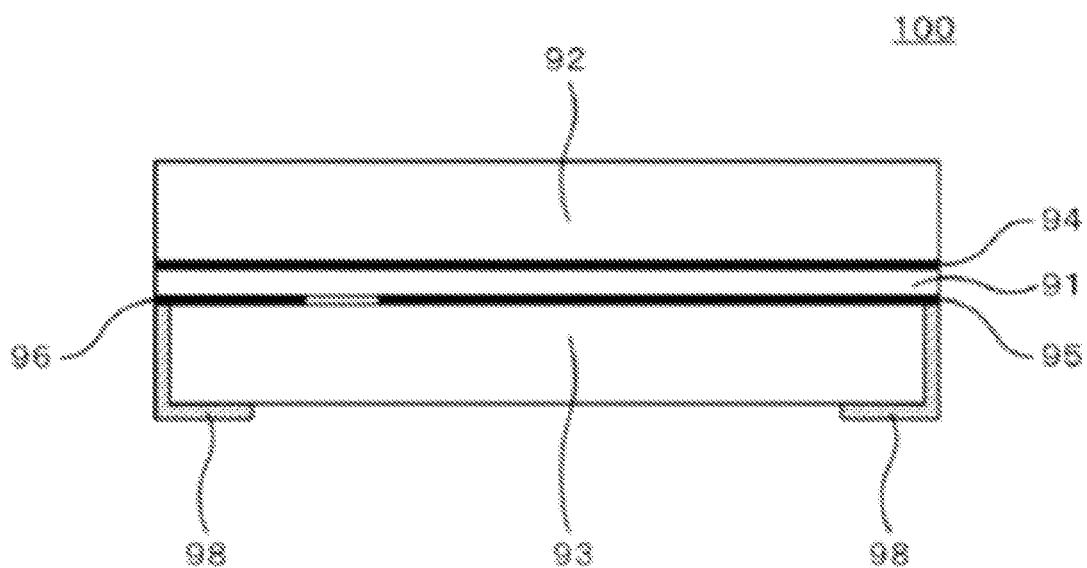
FIGS. 1A and 1B illustrate a conventional problem.
Figure 1B:
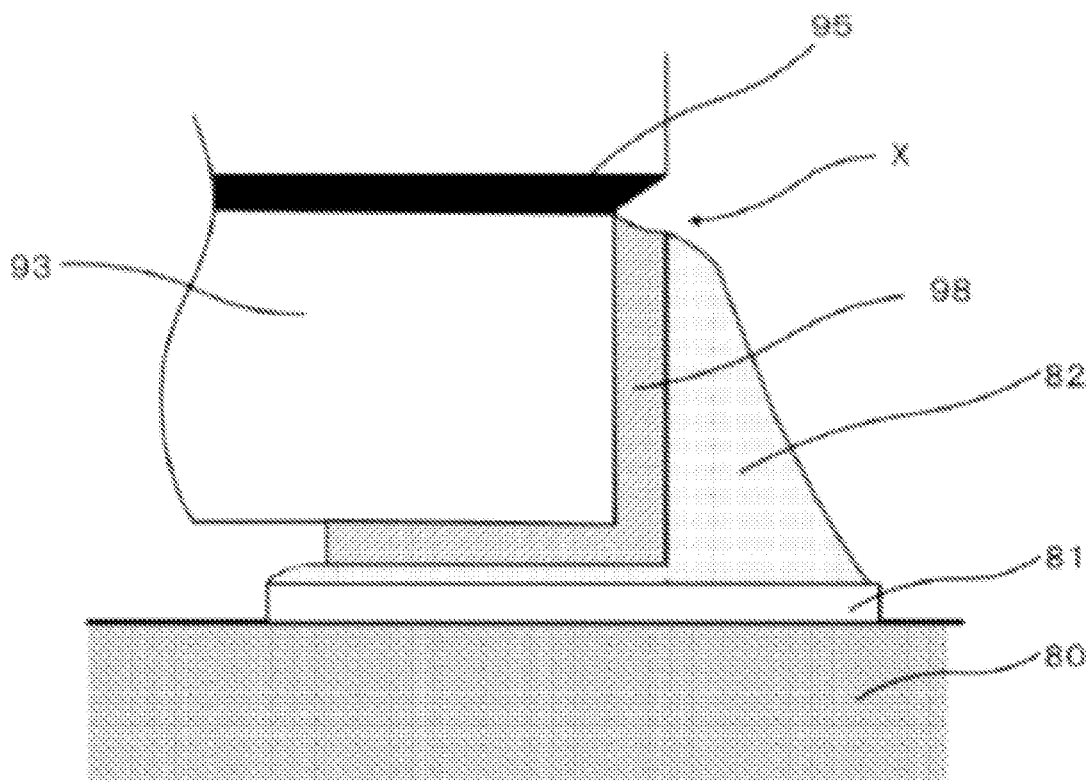
Figure 2:
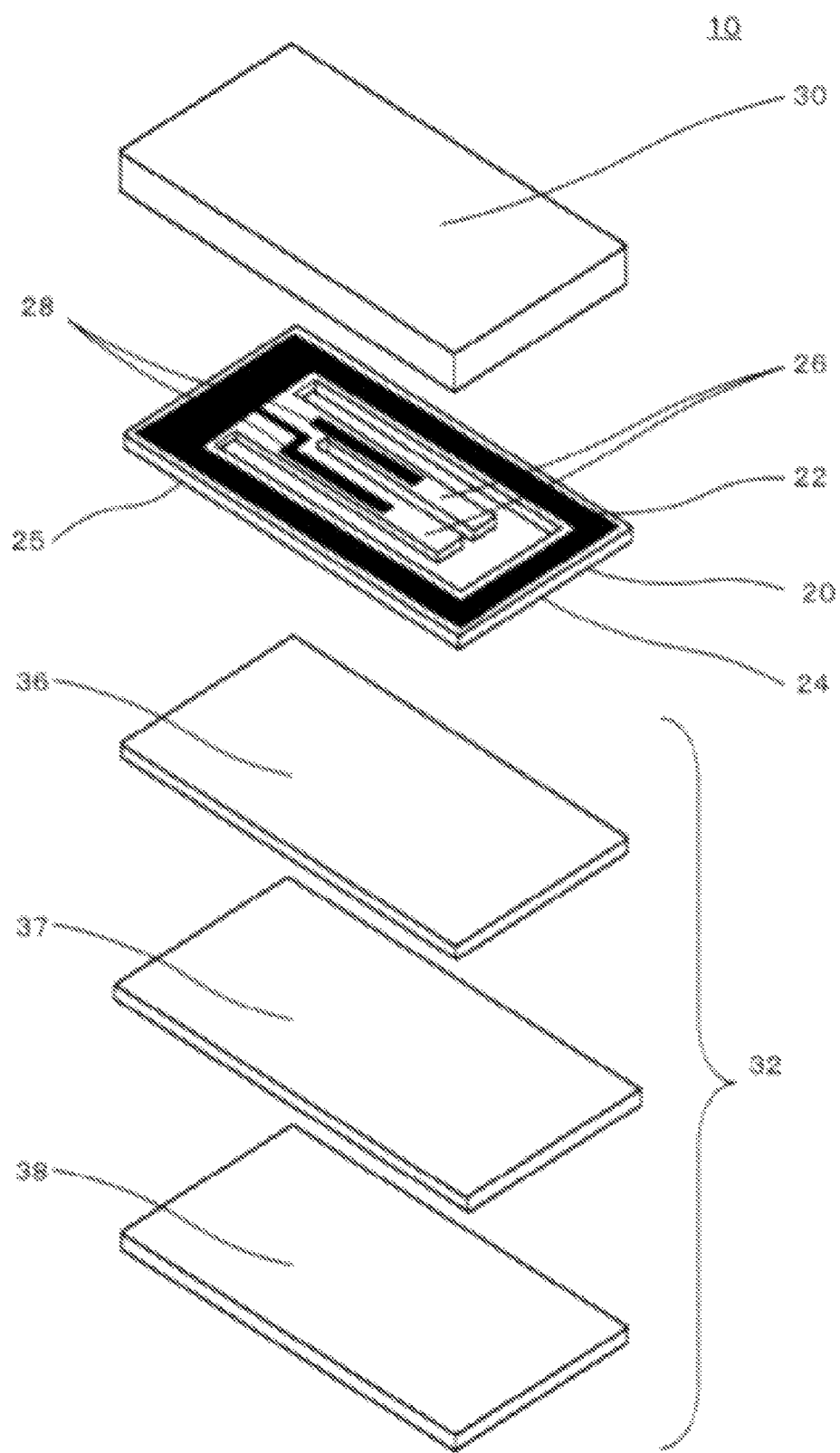
FIG. 2 illustrates a structure of a crystal resonator according to a first embodiment.

FIG. 2 is an exploded perspective view of a crystal resonator 10 according to a first embodiment.

The crystal resonator 10 of the first embodiment includes a crystal resonator plate 20 having a crystal resonator piece 26 that is made of crystal ($SiO_2$), for instance, and that is shaped like a tuning fork, a lid glass 30 bonded to a first surface on the front side of the crystal resonator plate 20 and configured to hermetically seal the crystal resonator piece 26 in a vibratable state and to form a lid body of the crystal resonator plate 20, and a base glass 32 bonded to a second surface on the back side of the crystal resonator plate 20 and configured to hermetically seal the crystal resonator piece 26 in a vibratable state and to form a lid body of the crystal resonator plate 20.

In a center part of the crystal resonator plate 20, the crystal resonator piece 26 surrounded by an opening part and shaped like the tuning fork is formed and excitation electrode films 28 configured to vibrate the crystal resonator piece 26 are formed on surfaces of the crystal resonator piece 26. An upper bonding film 22 that is made of the same material as the material of the excitation electrode films 28 and that becomes an actual bonding part for the lid glass 30 is provided on a surface of a frame-like part that surrounds the crystal resonator piece 26.

Though not illustrated, the excitation electrode film 28 configured to vibrate the crystal resonator piece 26 is formed on the surface of the crystal resonator piece 26 on the back side of the crystal resonator plate 20 as on the front side. Lower bonding films 24, 25 that are made of the same material as the material of the excitation electrode films 28 and that become actual bonding parts for the base glass 32 are provided on a surface of the frame-like part that surrounds the crystal resonator piece 26.

The excitation electrode films 28, the upper bonding film 22, and the lower bonding films 24, 25 are 1100 Å Al layers formed by sputtering or vacuum deposition, for instance.

The base glass 32 is made of a three-layer structure having three glass plates formed of soda-lime glass, silicon, or the like. In the three glass plates, having generally even thicknesses, a length in a longitudinal direction of a second glass plate 37 at the middle position is greater than a length in the longitudinal direction of a first glass plate 36 on the top of the second glass plate 37. The length in the longitudinal direction of the second glass plate 37 at the middle position is greater than a length in the longitudinal direction of a third glass plate 38 on the bottom of the second glass plate 37.

Figure 3A:
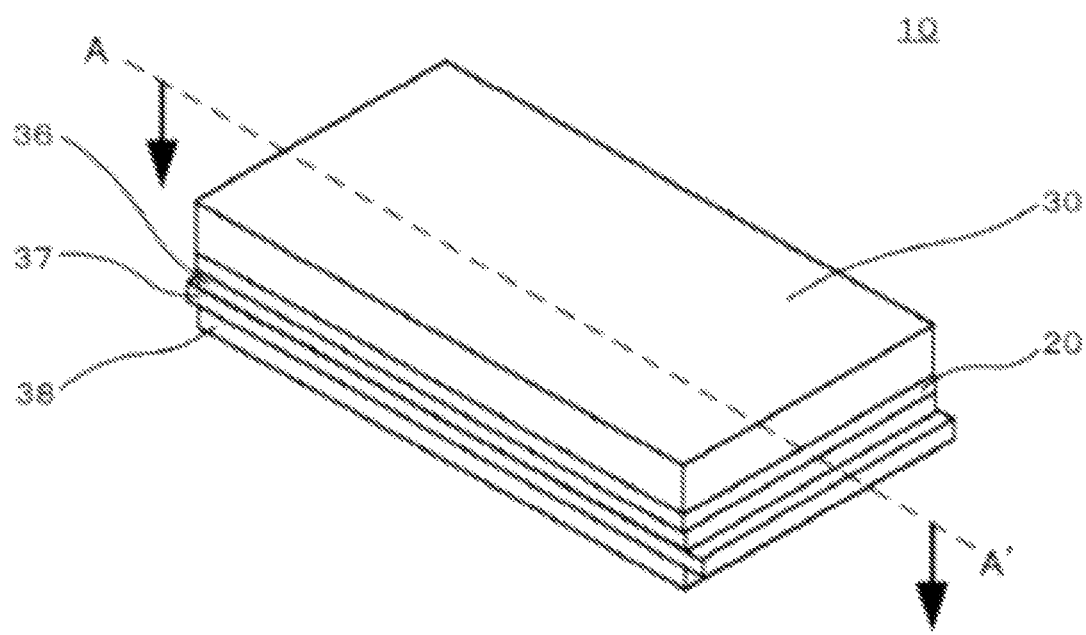
FIGS. 3A and 3B illustrate the structure of the crystal resonator according to the first embodiment.

FIG. 3A is a perspective view of the crystal resonator 10 according to the embodiment in which components of the exploded perspective view illustrated in FIG. 2 are assembled without modification. In the three glass plates under the crystal resonator plate 20, as seen looking on a short side surface of the crystal resonator 10, the second glass plate 37 at the middle position protrudes relative to the first glass plate 36 and the third glass plate 38.

Figure 3B:
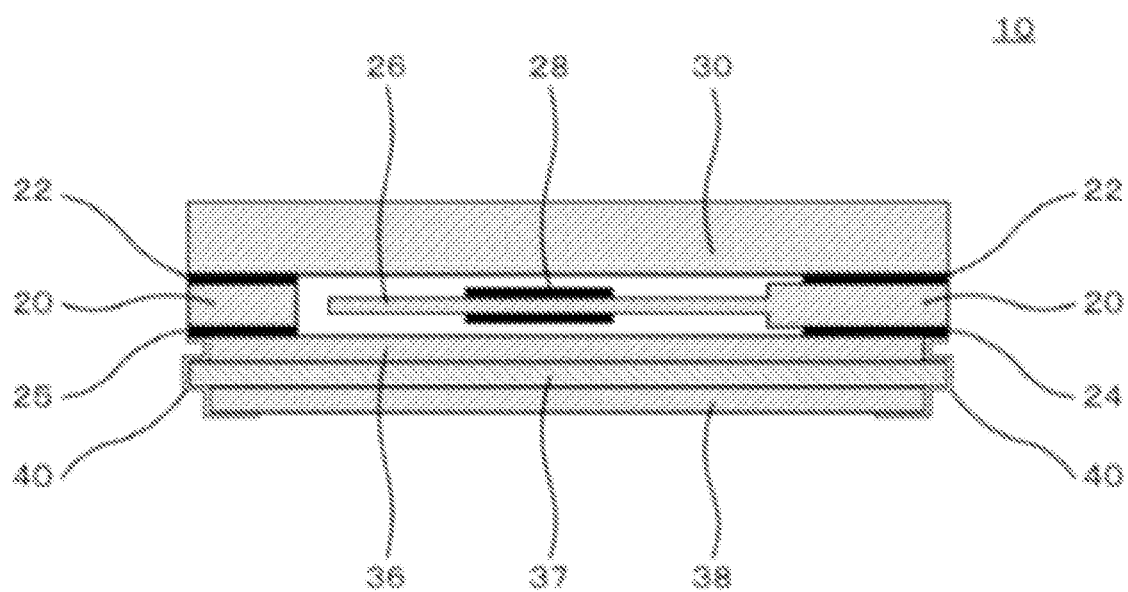

FIG. 3B illustrates a section of the crystal resonator 10 illustrated in FIG. 3A and cut in a direction of arrows from a line IIIB-IIIB. External terminals 40 are formed so as to extend from side surfaces of the three glass plates to the bottom surface of the third glass plate 38 at the lowest position.

The external terminal 40 at the left in FIG. 3B is in contact with the lower bonding film 25 on the bottom surface of the crystal resonator plate 20. The lower bonding film 25 is connected by through vias not illustrated to the upper bonding film 22 on the top surface of the crystal resonator plate 20. There is continuity between the upper bonding film 22 and the excitation electrode film 28 on the top surface of the crystal resonator piece 26.

The external terminal 40 at the right in FIG. 3B is in contact with the lower bonding film 24 on the bottom surface of the crystal resonator plate 20. There is continuity between the lower bonding film 24 and the excitation electrode film 28 on the bottom surface of the crystal resonator piece 26.

With the crystal resonator 10 mounted on a circuit board, application of a voltage to electrode pads on the circuit board provides a voltage difference between the excitation electrode films 28 on the top and bottom surfaces of the crystal resonator piece 26 and thereby causes resonance of the crystal resonator piece 26, so that a predetermined frequency is generated.

Figure 4A:
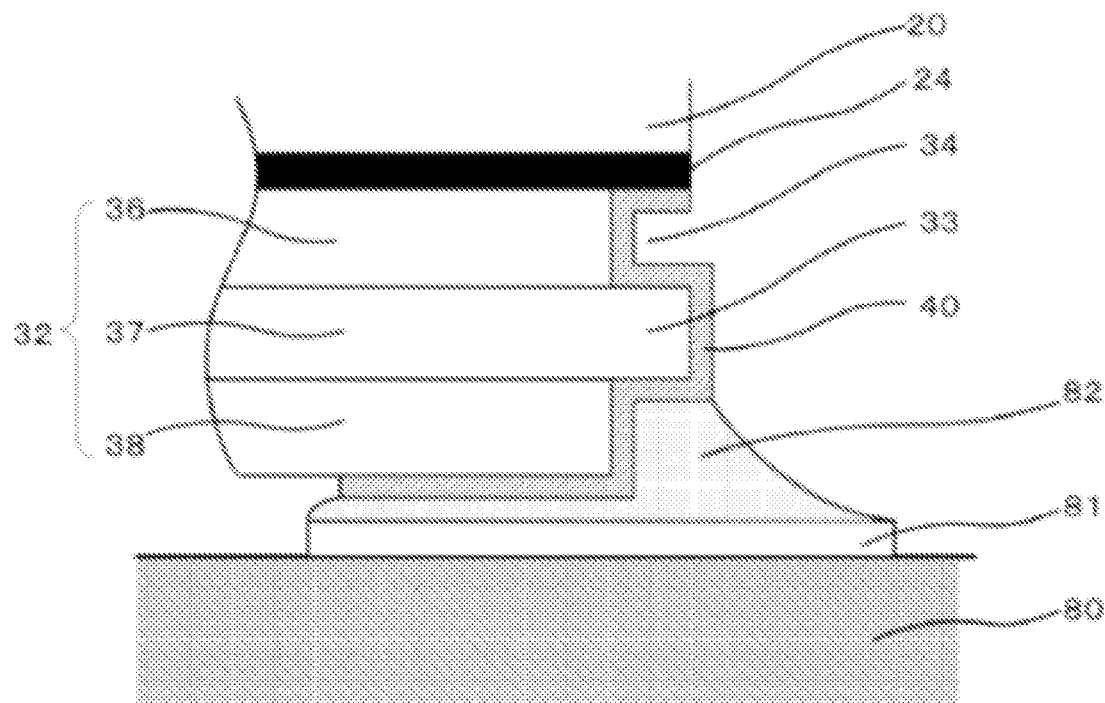
FIGS. 4A and 4B illustrate effects of the crystal resonator according to the first embodiment.

Subsequently, effects of the crystal resonator 10 of the embodiment will be described with reference to FIG. 4. FIG. 4A and FIG. 4B are enlarged views of a bonding part between the electrode pad 81 on the circuit board 80 and the external terminal 40 of the crystal resonator 10, as seen looking from a side surface, in a state in which the crystal resonator 10 is mounted on the circuit board 80.

For mounting of the crystal resonator 10 of the embodiment on the circuit board 80, thin solder 82 is applied onto the electrode pads 81 on the circuit board 80, and the crystal resonator 10 is placed so that bottom surfaces of the external terminals 40 of the crystal resonator 10 come into contact with the solder.

Upon subsequent performance of reflow, the solder 82 soaks and spreads under protrusions 33. Then a decrease in temperature solidifies the solder 82 under the protrusions 33, as illustrated in FIG. 4A. Even if the external terminals 40 undergo solder erosion in some degree, borders of the lower bonding film 24 on the crystal resonator plate 20 undergo no change. Upon subsequent performance of the second reflow in this state, the melted solder 82 does not go above the protrusions 33, and thus the lower bonding film 24 undergoes no solder erosion.

Figure 4B:
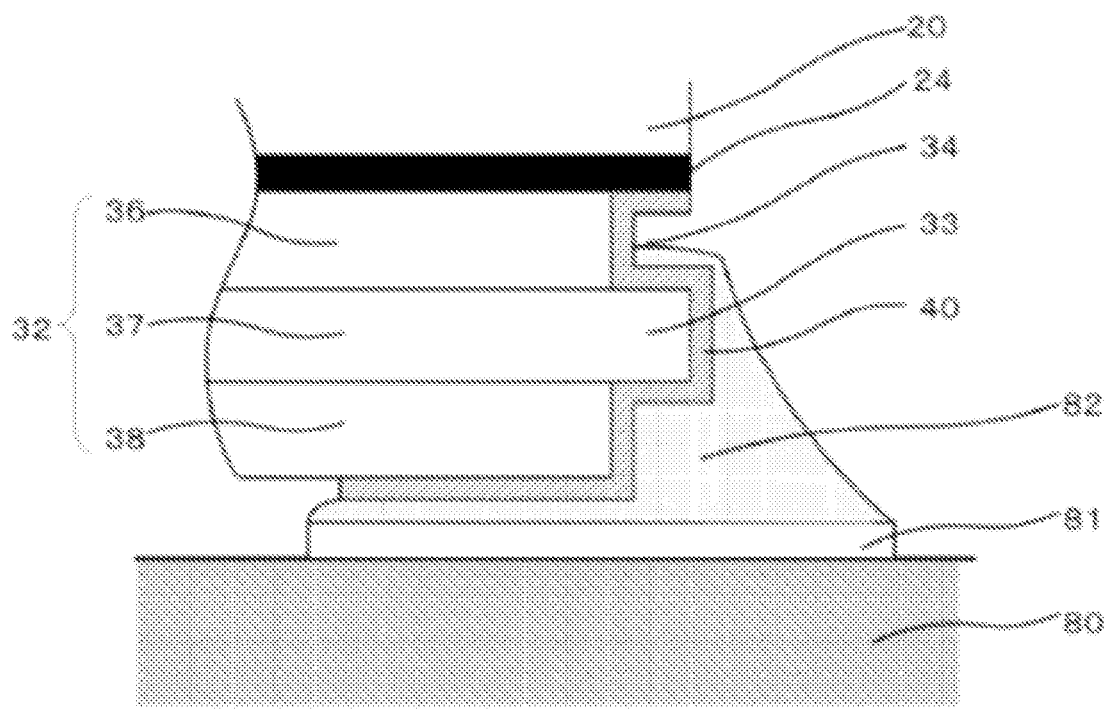

Even if too large amount of the solder 82 is applied onto the electrode pads 81 on the circuit board 80 as illustrated in FIG. 4B, the melted solder 82 does not come into contact with the lower electrode 24 because the melted solder 82 flows into recesses 34 above the protrusions 33. Even if the external terminals 40 undergo the solder erosion in some degree, the borders of the lower bonding film 24 on the crystal resonator plate 20 undergo no change. Upon subsequent performance of the second reflow in this state, the melted solder 82 does not reach the lower bonding film 24 because the melted solder 82 remains in the recesses 34 above the protrusions 33. Therefore, the lower bonding film 24 undergoes no solder erosion.

In accordance with the crystal resonator 10 of the embodiment, in soldering of the crystal resonator 10 on the circuit board 80, the protrusions 33 on the side surfaces of the base glass 32 to be mounted make it difficult for the melted solder to come into contact with the lower electrodes 24, 25. As a result, the crystal resonator 10 may be provided that resists the solder erosion of the electrodes and that is highly reliable.

Herein below, production processes for the crystal resonator 10 will be described with reference to FIGS. 5, 6, and a flow chart of FIG. 7. The crystal resonator 10 is formed of a five-layer structure as described with reference to the exploded perspective view of FIG. 2.

Figure 5A:
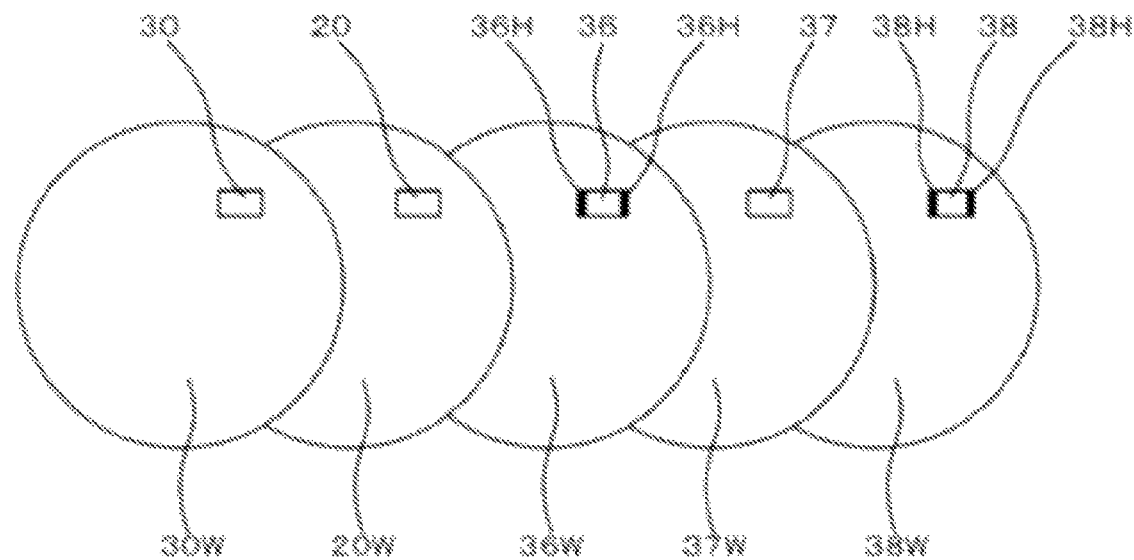
FIGS. 5A and 5B illustrate a production method for the crystal resonator according to the first embodiment.

As illustrated in FIG. 5A, initially, five wafers, that is, a glass wafer 30W for lid that is material of the lid glass 30, a crystal wafer 20W that is material of the crystal resonator plate 20, a first glass wafer 36W that is material of the first glass plate 36, a second glass wafer 37W that is material of the second glass plate 37, and a third glass wafer 38W that is material of the third glass plate 38 are prepared. An appellation of "wafer" refers to plate-like material having a size equivalent to sizes of semiconductor wafers. The wafers are used because the wafers are convenient for production using production apparatus for semiconductor devices.

In the embodiment, for instance, a glass plate with a thickness of 0.4 mm is used as the glass wafer 30W for lid. A crystal plate with a thickness of 0.13 mm is used as the crystal wafer 20W, for instance. For instance, 0.13 mm glass plates are used as the first glass wafer 36W, the second glass wafer 37W, and the third glass wafer 38W.

The components of the crystal resonator 10 are formed at the same position in the glass wafer 30W for lid, the crystal wafer 20W, the first glass wafer 36W, the second glass wafer 37W, and the third glass wafer 38W.

Figure 5B:
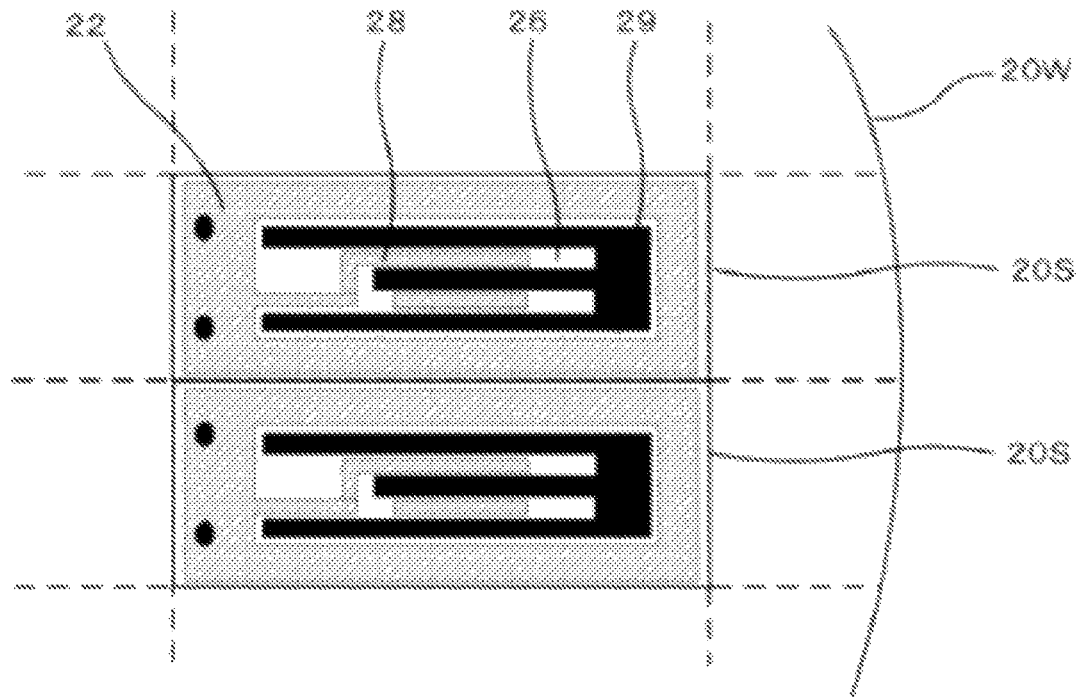

As illustrated in FIG. 5B, initially, a plurality of crystal resonator plate regions 20S are formed on the crystal wafer 20W. Subsequently, the opening part 29 shaped like a letter "E" is formed at a generally center part in each of the crystal resonator plate regions 20S. A part surrounded by the opening part 29 forms the crystal resonator piece 26, and a part surrounding the opening part 29 forms the frame-like part (step S1 in FIG. 7).

Subsequently, the top and bottom surfaces of the crystal resonator piece 26 are etched so that the thickness of the crystal resonator piece 26 becomes smaller than the thickness of the frame-like part (step S2).

Subsequently, metal films are deposited and formed by sputtering or the like on the surfaces of the crystal resonator piece 26 and the surfaces of the frame-like part (step S3). Though material of the metal films is not especially limited, aluminum (Al), chromium (Cr), or the like is preferably used therefor, for instance, and aluminum is used in the embodiment.

Subsequently, the metal film is patterned so that the excitation electrode film 28 is formed on the crystal resonator piece 26 and so that the upper bonding film 22 is formed along the overall periphery on a part corresponding to the frame-like part there around (step S4).

Similarly, on the back side of each crystal resonator plate region 20S, the excitation electrode film 28 is formed on the crystal resonator piece 26 and the lower bonding films 24, 25 are formed along the overall periphery on a part corresponding to the frame-like part there around.

Referring to FIG. 5A, opening parts 36H are formed on both sides of each region to be formed into the first glass plate 36 on the first glass wafer 36W (step S6).

Similarly, opening parts 38H are formed on both sides of each region to be formed into the third glass plate 38 on the third glass wafer 38W (step S7).

Figure 6A:
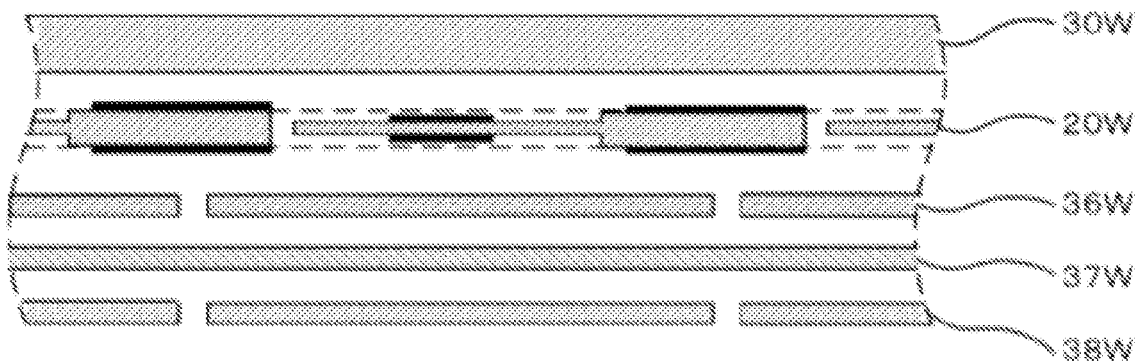
FIGS. 6A to 6C illustrate the production method for the crystal resonator according to the first embodiment.

Subsequently, as illustrated in FIG. 6A, the third glass wafer 38W, the second glass wafer 37W, the first glass wafer 36W, the crystal wafer 20W, and the glass wafer 30W for lid are laminated in alignment with one another (step S8).

Figure 6B:
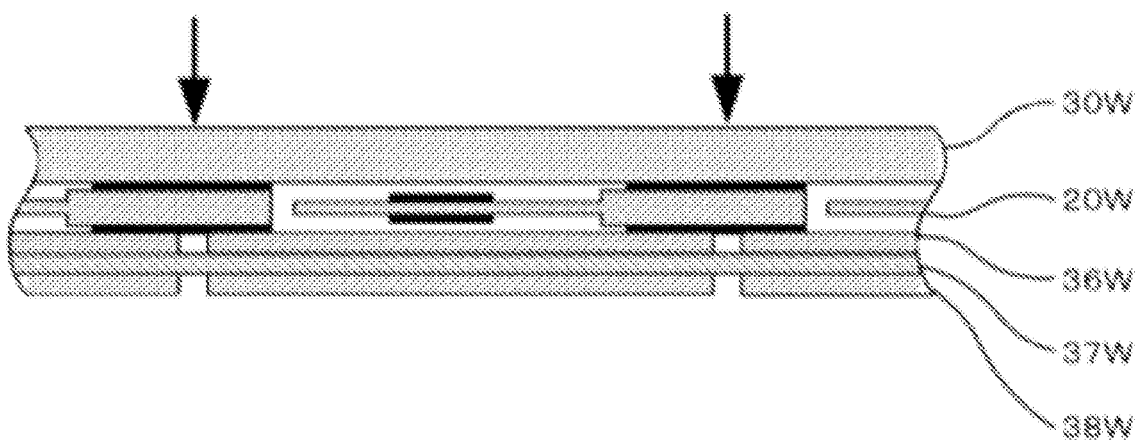

Subsequently, as illustrated in FIG. 6B, the laminated wafer group is anodically bonded in inert gas with application of a voltage to the wafer group (step S9). It is then preferable to heat the wafer group to a temperature between 100° C. and 150° C., for instance, which is lower than the softening point of glass and to apply a DC voltage between 3 kV and 5 kV to the wafer group. In the embodiment, for instance, the wafers are heated to about 120° C. and the DC voltage of about 3.5 kV is applied to the wafers.

Figure 6C:
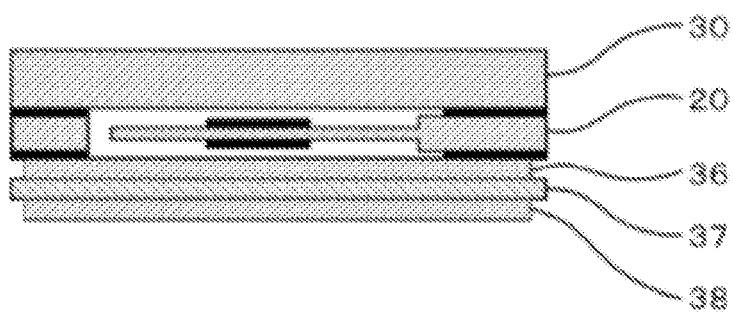

Subsequently, with use of a device to dice semiconductor wafers, the anodically bonded wafer group is diced at positions illustrated by arrows in FIG. 6B, and singulation is attained as illustrated in FIG. 6C (step S10).

Finally, sputtering with 600 Å Cr and 1500 Å Au is repeated three times to form the external terminals 40 with a thickness of 0.63μ on parts extending on the side surfaces of the first glass plate 36, the second glass plate 37, and the third glass plate 38 and the bottom surface of the third glass plate 38 so that the external terminals 40 are connected to the lower bonding film 24 on the bottom surface of the crystal resonator plate 20 (step S11).

Finally, a structure of a crystal resonator 10B of a second embodiment will be described with reference to FIG. 8.

Figure 8A:
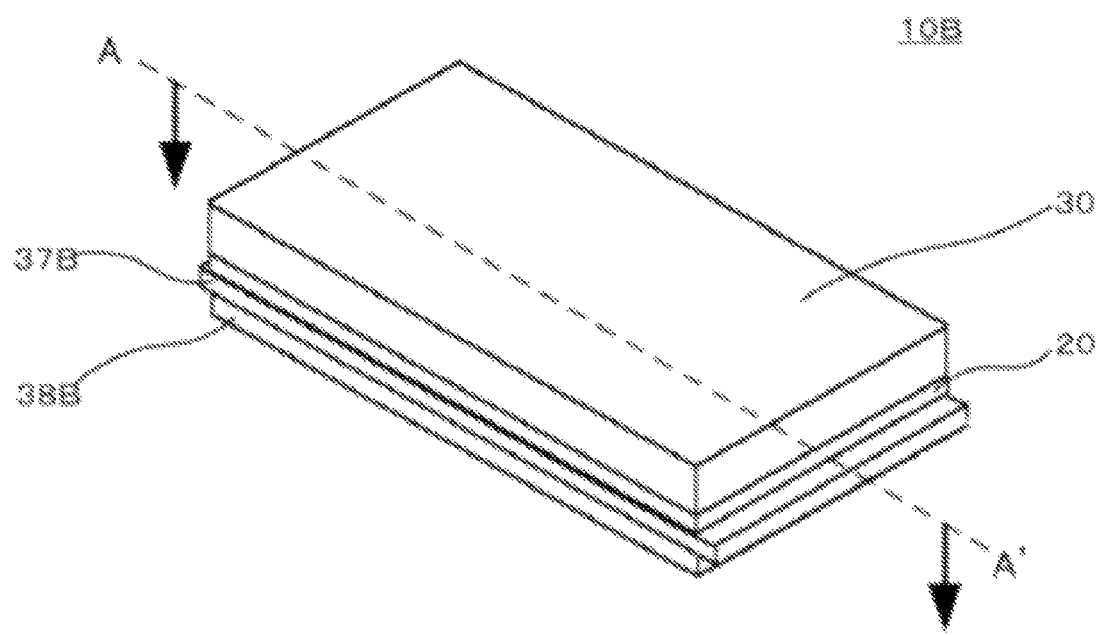
FIGS. 8A and 8B illustrate a structure of a crystal resonator according to a second embodiment.
Figure 8B:
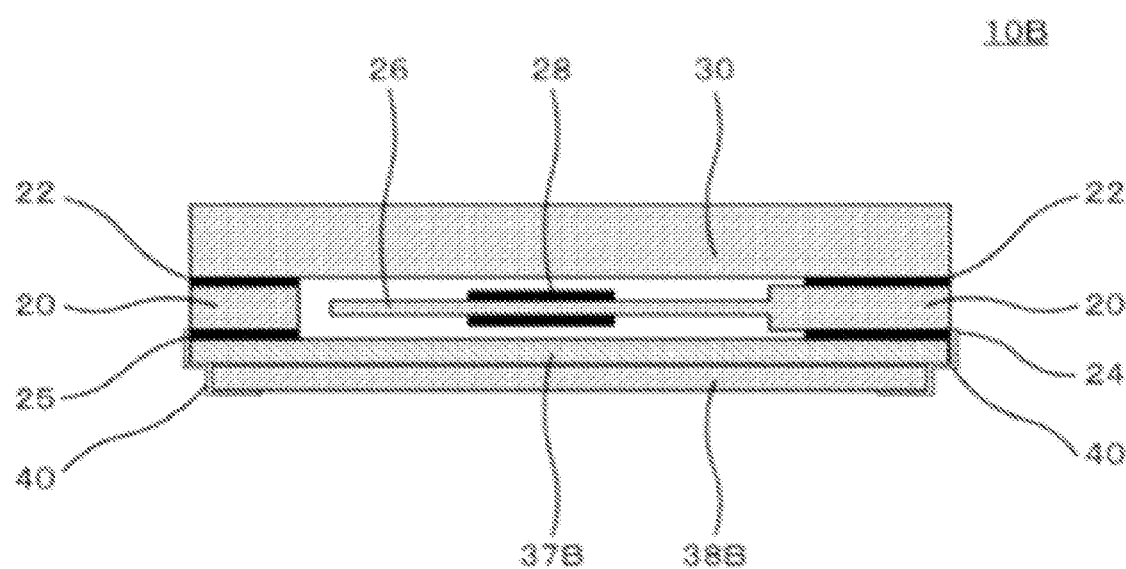

FIG. 8A is a perspective view of the crystal resonator 10B according to the second embodiment. FIG. 8B illustrates a section of the crystal resonator 10B illustrated in FIG. 8A and cut in a direction of arrows from a line VIIIB-VIIIB.

In the crystal resonator 10B according to the second embodiment, glass plates under the crystal resonator plate 20 are composed of two plates. In the two glass plates, referring to FIG. 8B, left and right end surfaces of a lower glass plate 38B are recessed relative to end surfaces of an upper glass plate 37B. The external terminals 40 are formed so as to extend from left and right side walls of the two glass plates in FIG. 8B to the bottom surface of the lower glass 38B.

Even if portions of the external terminals 40 undergo solder erosion in the first soldering, solder melted in the second reflow does not come into direct contact with the lower electrodes 24, 25 under the crystal resonator plate 20 because the external terminals 40 are formed so as to cover the side surfaces of the lower electrodes 24, 25 under the crystal resonator plate 20. Thus the crystal resonator 10B that resists solder erosion of the electrodes and that is highly reliable may be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A crystal resonator comprising:
lower glass plates on which first electrodes are formed so as to extend from side surfaces to a bottom surface of the lower glass plates;

a crystal plate which is provided over the lower glass plates and on which second electrodes to be coupled to the first electrodes are formed on a surface in contact with the lower glass plates; and an upper glass plate which is provided over the crystal plate;

wherein the side surfaces of the lower glass plates on which the first electrodes are formed are provided with a protrusion that extends in parallel with a top surface and the bottom surface of the lower glass plates and that extends from one end to the other end of each of the side surfaces, and wherein the first electrodes are formed on the side surfaces that include surfaces of the protrusion.

2. The crystal resonator according to claim 1,
wherein the side surfaces of the lower glass plates between the protrusion and the second electrodes on the crystal plate are provided with recesses that extend in parallel with the top surface and the bottom surface of the lower glass plates and that each extend from the one end to the other end of each of the side surfaces.

3. The crystal resonator according to claim 1,
wherein the lower glass plates include
a first glass plate, and
a second glass plate which is laminated on the first glass plate and of which a size of a side is greater than a size of a side of the first glass plate,
wherein both ends of the second glass plate protrude relative to ends of the first glass plate and form the protrusions.

4. The crystal resonator according to claim 3, further comprising:
a third glass plate which is laminated on the second glass plate and of which a size of a side is surpassed by the size of the side of the second glass plate.

5. A production method for a crystal resonator, the method comprising:
forming first through holes on a first glass plate;
laminating a second glass plate over the first glass plate;
forming second through holes at same positions on a third glass plate as the first through holes formed on the first glass plate;
laminating the third glass plate over the second glass plate;
forming a crystal resonator piece in a crystal plate and bonding films on both surfaces of the crystal plate;
laminating the crystal plate over the third glass plate;
laminating a fourth glass plate over the crystal plate; and
anodically bonding the first through third glass plates, the crystal plate, and the fourth glass plate by application of a voltage between the first glass plate and the fourth glass plate.

6. The production method for the crystal resonator according to claim 5,
wherein a plurality of crystal resonators are formed by collective dicing of the first through third glass plates, the crystal plate, and the fourth glass plate that have been anodically bonded.

7. A production method for a crystal resonator, the method comprising:
forming first through holes on a first glass plate;
laminating a second glass plate on the first glass plate;
forming a crystal resonator piece in a crystal plate and bonding films on both surfaces of the crystal plate;
laminating the crystal plate over the second glass plate;
laminating a third glass plate over the crystal plate; and
anodically bonding the first glass plate, the second glass plate, the crystal plate, and the third glass plate by application of a voltage between the first glass plate and the third glass plate.

8. The production method for the crystal resonator according to claim 7,
wherein a plurality of crystal resonator are formed by collective dicing of the first glass plate, the second glass plate, the crystal plate, and the third glass plate that have been anodically bonded.

9. Electronic equipment comprising:
a circuit board including a plurality of electrode pads; and
a crystal resonator mounted over the circuit board, the crystal resonator including
lower glass plates on which first electrodes are formed so as to extend from side surfaces to a bottom surface of the lower glass plates,
a crystal plate which is provided over the lower glass plates and on which second electrodes to be coupled to the first electrodes are formed on a surface in contact with the lower glass plates, and
an upper glass plate which is provided over the crystal plate;
wherein the side surfaces of the lower glass plates on which the first electrodes are formed are provided with protrusions that extend in parallel with a top surface and the bottom surface of the lower glass plates and that each extend from one end to the other end of each of the side surfaces,
wherein the first electrodes are formed on the side surfaces that include surfaces of the protrusions, and
wherein the first electrodes and the electrode pads are bonded by solder provided between the protrusions and the electrode pads.

10. The electronic equipment according to claim 9, further comprising:
on the side surfaces of the lower glass plates between the protrusions and the second electrodes on the crystal plate, recesses that extend in parallel with the top surface and the bottom surface of the lower glass plates and that each extend from the one end to the other end of each of the side surfaces,
wherein the solder is also provided in the recesses.

* * * * *